United States Patent [19]
Tran et al.

[11] Patent Number: 5,281,861
[45] Date of Patent: Jan. 25, 1994

[54] SINE WAVE CLOCK DISTRIBUTION WITH HIGH VOLTAGE OUTPUT

[75] Inventors: Thanh T. Tran, Tomball; Clarence Y. Mar, Austin; Javier F. Izquierdo, Houston, all of Tex.

[73] Assignee: Compaq Computer Corporation, Houston, Tex.

[21] Appl. No.: 855,453

[22] Filed: Mar. 19, 1992

Related U.S. Application Data

[63] Continuation of Ser. No. 444,116, Nov. 30, 1989.

[51] Int. Cl.⁵ .................. H03K 5/00; H03K 5/13; H03K 7/00; H03B 19/00
[52] U.S. Cl. .................... 307/269; 307/261; 307/480; 328/13; 328/22; 328/63; 328/72
[58] Field of Search .............. 307/269, 408, 261; 328/34, 60, 62, 28, 32, 13; 377/20; 439/101

[56] References Cited

U.S. PATENT DOCUMENTS

| | | | |
|---|---|---|---|
| 4,052,676 | 10/1977 | Crittenden | 377/20 |
| 4,571,012 | 2/1986 | Bassler et al. | 439/101 |
| 4,665,372 | 5/1987 | Schwartz | 307/261 |
| 4,707,665 | 11/1987 | Nugent et al. | 307/261 |
| 4,728,815 | 3/1988 | Main | 307/268 |
| 4,755,704 | 7/1988 | Flora et al. | 307/269 |
| 4,959,557 | 9/1990 | Miller | 307/269 |

OTHER PUBLICATIONS

Holt, "Electronic Circuits Digital and Analog", John Wiley & Sons, Inc., 1978, pp. 258–261 and 754–758.

Primary Examiner—William L. Sikes
Assistant Examiner—Trong Phan
Attorney, Agent, or Firm—Pravel, Hewitt, Kimball & Krieger

[57] ABSTRACT

A clock signal is distributed over a circuit board and across a connector as a sine wave. A circuit located near the clocked circuitry converts the sine wave into a same frequency square wave for use by the clocked circuitry. The output stage of the converter circuitry provides a high output level to drive CMOS circuitry. The output transistor is pulled up to 5 volts, but the preceding transistors are pulled up to 6.3 volts so that the base to emitter drops are compensated.

6 Claims, 3 Drawing Sheets

SINE WAVE CLOCK DISTRIBUTION WITH HIGH VOLTAGE OUTPUT

This is a continuation of co-pending application Ser. No. 07/444,116 filed on Nov. 30, 1989.

BACKGROUND OF THE INVENTION

1. Field of the Invention

The present invention relates to a method for distributing a high frequency clock signal in a computer system and a circuit for providing high voltage output levels from TTL circuitry to drive CMOS circuitry.

2. Description of the Related Art

Personal computers are getting ever faster and as a result are using ever high clock speeds. The speeds have progressed from early personal computers which used clock rates of 1 to 2 MHz to current systems which have an effective clock rate of 33 MHz and use a clocking input signal having a frequency of 66 MHz. While this higher clocking rate allows the microprocessor used in the personal computer to operate at a higher speed, it also creates significant design problems when concerned with the electromagnetic interference (EMI) levels necessary to meet certain standards as developed by the Federal Communications Commissions (FCC). The EMI problem becomes particularly sensitive when these high frequency clock signals must be transmitted over long distances on a circuit board and becomes extremely burdensome and troublesome when the clock signal must pass through a connector.

Connectors are being utilized more frequently in the design of personal computer systems with the ever changing microprocessors available because it has become desirable to place the microprocessor circuitry on a separate plug-in board which is connected through a socket and connector arrangement. The use of a separate board allows interchangeability of basic microprocessor types or addition of more processors in a multiprocessor environment. It is necessary to provide a basic clocking signal to this microprocessor and thus the clock signal must pass through the connector. The inclusion of the connector results in impedance matching and other similar problems. This results in a tendency for reflections to be developed in the clocking signal, which, if bad enough, may cause erroneous clocking signals to be received. The reflections also increase the EMI problems by introducing higher frequency components. While these problems can be solved using relatively conventional techniques, such as shielding and fencing, at frequences below 50 MHz, when the signals approach 66 MHz conventional techniques suffer undue complexity and increase dramatically in cost. Additionally, the reflections may have an effect on the actual clock skew as developed between various components. The runs must be carefully length and impedance matched if only a single source is to provide clocking and if no local clock deskewing circuitry is provided. In previous designs at these high clock rates matched coaxial lengths of cable was utilized or particular clock deskewing circuitry which included a series of delay lines was used. However each one of these techniques required that the system be tuned for each particular application, could not use conventional socket techniques and therefore were not readily acceptable for mass volume manufacturing.

In yet a further complication the microprocessors conventionally utilized in current personal computers are of CMOS design and thus require relatively high voltage levels at certain inputs to provide a guaranteed high level signal. This is particularly true in clocking circuits, where for example on the Intel Corporation (Intel) 80386 microprocessor the CLK2 input high voltage is specified to be at least 3.7 volts, assuming a nominal supply voltage of 5 volts. However, conventional TTL output high levels are typically 3.4 volts and worst case voltages are more often in the range of 2.5 to 2.7 volts. This clearly results in a problem. CMOS circuitry can be used, but at the higher frequencies, such as 66 MHz, the CMOS circuitry has too much device to device skew to allow a single source to drive multiple clocking signals at the necessary speeds. Therefore, if any sort of deskewing circuitry is utilized at the desired speeds, the circuitry must be developed using bipolar designs because of the instability of conventional CMOS designs. This use of bipolar circuitry results in the aforementioned voltage level problem. Pull up resistors can be utilized with bipolar circuitry but at the desired frequencies are not always effective. Thus there is a problem properly and inexpensively driving the high level input signals.

SUMMARY OF THE INVENTION

The current invention distributes the basic clock signal over the circuit board and through connectors to the microprocessor utilizing a sine wave having the fundamental frequency of the desired clock signal. At a location relatively near the specific device which requires the clocking signal a clock squaring circuit is located and utilized which develops a square wave in phase with the sine wave, thus resulting in very little transmission of a high frequency square wave and the resulting EMI creating harmonics. The use of the sine wave reduces the skew between the various locations, reduces the reflections developed at connections and other points and reduces the potential for EMI concerns because no high harmonics exist as they do when a square wave is distributed.

The clock squaring circuitry develops the basic clock signal frequency square wave and divides this basic signal by two to provide a signal similar to the internal clocking signal utilized in the preferred 80386 microprocessor. Multiple outputs are provided by the clock squaring circuitry, the outputs being carefully matched to reduce relative skew problems. The clock squaring circuitry is fabricated in a bipolar technology to accomplish this reduced skew. The actual output drivers in the clock squaring circuitry have an altered design wherein only the final transistor in the pull up output stage is connected to the 5 volt level, while the previous stages which drive this final transistor stage are connected to a higher reference voltage, preferably 6.3 volts. In this manner the various base to emitter drops are compensated so that the actual output voltage of the high level is within the specifications necessary to drive the clocking inputs of the desired microprocessor and related family of devices.

BRIEF DESCRIPTION OF THE DRAWINGS

A better understanding of the prior art and the present invention can be obtained when the following detailed description of the preferred embodiment is considered in conjunction with the following drawings, in which.

DESCRIPTION OF THE PREFERRED EMBODIMENT

Figure 1:
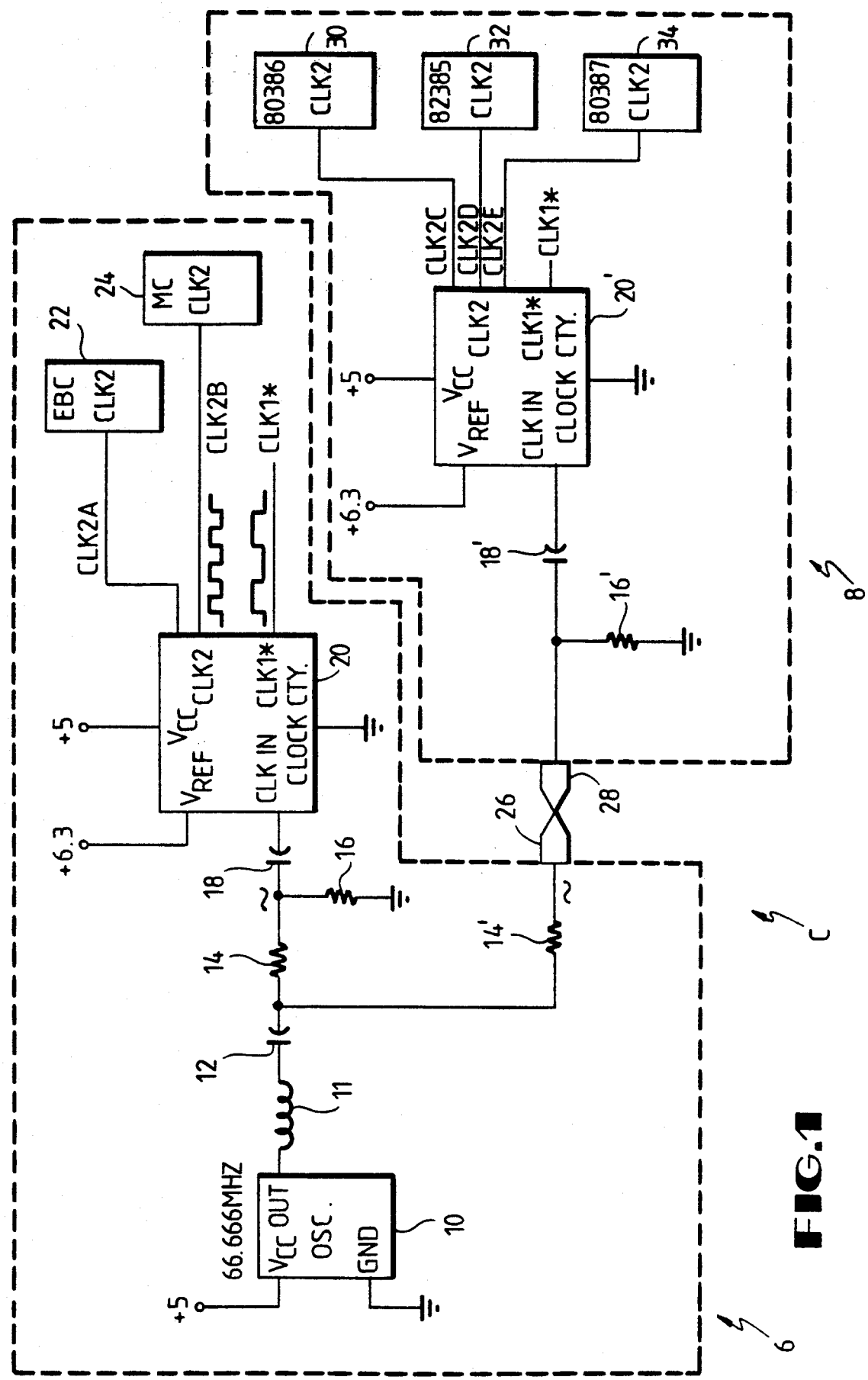
FIG. 1 is a schematic and block diagram of the circuit incorporating the distribution of a sine wave clock signal according to the present invention.

Referring now to FIG. 1, an oscillator module 10 produces the basic clock signal at the desired frequency to be used in the computer system, generally represented by a letter C. In the preferred embodiment the clock signal is 66.666 MHz for use with the 33 MHz versions of the various components used in the computer system C. The oscillator 10 can provide an output which is a square wave or a sine wave. The output of the oscillator 10 is provided to an inductor 11 and a capacitor 12 to provide a band pass filter in the case of a square wave output from the oscillator 10 and direct current voltage blocking. The inductor 11 is not utilized if the oscillator 10 provides a sine wave output. The sine wave signal developed after the capacitor 12 is a highly symetrical wave form, thus allowing component clock signal duty cycle tolerances to be easily met. A resistor 14 is connected between the capacitor 12 and a resistor 16 which is connected to ground. Also connected to the junction of the resistors 14 and 16 is one terminal of a capacitor 18 whose second terminal is connected to the clock in input of the clock squaring circuitry 20 of the present invention. In this way an output having the desired fundamental frequency is provided by the oscillator 10, with the inductor 11 and the capacitor 12 forming a sine wave signal from a square wave or capacitor 12 blocking any direct current portion developed by the oscillator 10 for sine wave output cases and the capacitor 18 blocking any direct current component which has been induced as the basic clocking signal sine wave traverses a circuit board 6 and allowing biasing of the input of the clock squaring circuitry 20.

In the example shown the clock squaring circuitry 20 is located on the circuit board 6 as the oscillator 10. The clock squaring circuitry 20 has, in addition to the conventional power supply $V_{cc}$ and ground inputs of 5 volts and ground, has a higher voltage input, preferably 6.3 volts or $V_{ref}$ which is used to help develop the high voltage high output levels according to the present invention. The clock squaring circuitry 20 produces a plurality of output signals referred to generically as the CLK2 signals which are within certain skew requirements of each other and are of the same frequency and approximately the same duty cycle as the input clock signal. However, the CLK2 signals are square wave signals which can be utilized by the various components. The CLK2 signals can be provided by, for example, a CLK2A signal to the CLK2 input of an EISA bus controller such as the 82358 made by Intel 22 or a CLK2B signal to the CLK2 input of a memory controller 24.

The clock squaring circuitry 20 also produces a square wave cycle which has ½ the frequency of the input clock signal and which is referred to as the CLK1* signal. The CLK1* signal is also used by circuitry (not shown) for timing purposes.

A second resistor 14' has one end connected to the junction between the capacitor 12 and the resistor 14. The other terminal of the resistor 14' is connected to a connector 26, preferably a female socket adapted to receive a card edge from an interchangeable circuit board 8. The mating connector portion, preferably the card edge 28, is located on the interchangeable circuit board 8, which contains the microprocessor 30 utilized in the computer system C. A resistor 16' is connected between ground and the input terminal 28. Also connected between the input terminal 28 and the clock input of the clock circuit 20 prime is a coupling capacitor 18'. Thus in this way the sine wave developed after the capacitor 12 is transmitted through the connector 26 and 28 and provided to the clock input of a second clock squaring circuit 20'. By utilizing a sine wave instead of a conventional square wave the number of harmonics present in the signal is reduced, resulting in reduced EMI development, either by the traces on the circuit board 6, the interchangeable circuit board 8, or the connector. Further, because pure sine wave operation is being utilized the reflection effects are limited, as is clock skew.

The inductor 11 preferably has a value of 0.56 $\mu$H; the capacitors 12, 18 and 18' preferably have values of 0.1 $\mu$F when the oscillator 10 produces a sine wave and values of 10 pF, 0.1 $\mu$F and 0.1 $\mu$F when the oscillator 10 produces a square wave; the resistors 14 and 14' preferably have values of 100 ohms; and the resistors 16 and 16' preferably have values of 56.2 ohms, the characteristic impedance of the conductors on the circuit board of the preferred embodiment. Other values could be used based on the desired oscillator output level and wave form, the transmission lengths and other factors.

The clock squaring circuitry 20' is similar to the clock squaring circuitry 20 and in the embodiment shown provides three output CLK2 signals, CLK2C, CLK2D, CLK2E to, respectively, the microprocessor 30, the cache controller 32 and the numeric coprocessor 34. According to the preferred embodiment of the present invention the microprocessor 30 is preferably the 80386 developed by Intel, the cache controller 32 is the 82385, developed by Intel, and the numeric coprocessor 34 is the 80387 developed by Intel and/or the WTL 3167 developed by Weitek. It is noted that the CLK2 inputs of the microprocessor 30, the cache controller 32 and the numeric coprocessor 34 all require high levels of at least 3.7 volts when using a 5 volt nominal supply voltage. More information on the particular voltage as required by the particular component can be developed by referencing the appropriate data manual as published by Intel or the manufacturer of the components being utilized.

Further taps can be developed between the capacitor 12 and the resistor 14 for providing the clock signal to more locations. For each desired location a resistor equivalent to the resistor 14' is added, with equivalents of the resistor 16', the capacitor 18' and the clock squaring circuitry 20' being connected in a like manner to the tapping additional resistor. For example, a further tap can go through an additional resistor 14" to an additional interchangeable circuit board 8'. The resistor 14" is simply the equivalent of the resistor 14'. The interchangeable circuit board 8' connects to the circuit board 6 through the connectors 26' and 28', which are the equivalents of the connectors 25 and 28. Of course, the additional circuit board 8' has a resistor 16", a capacitor 18", and additional clock squaring circuitry 20", which are the equivalents to the resistor 16', the capacitor 18' and the second clock squaring circuitry 20'.

Figure 2:
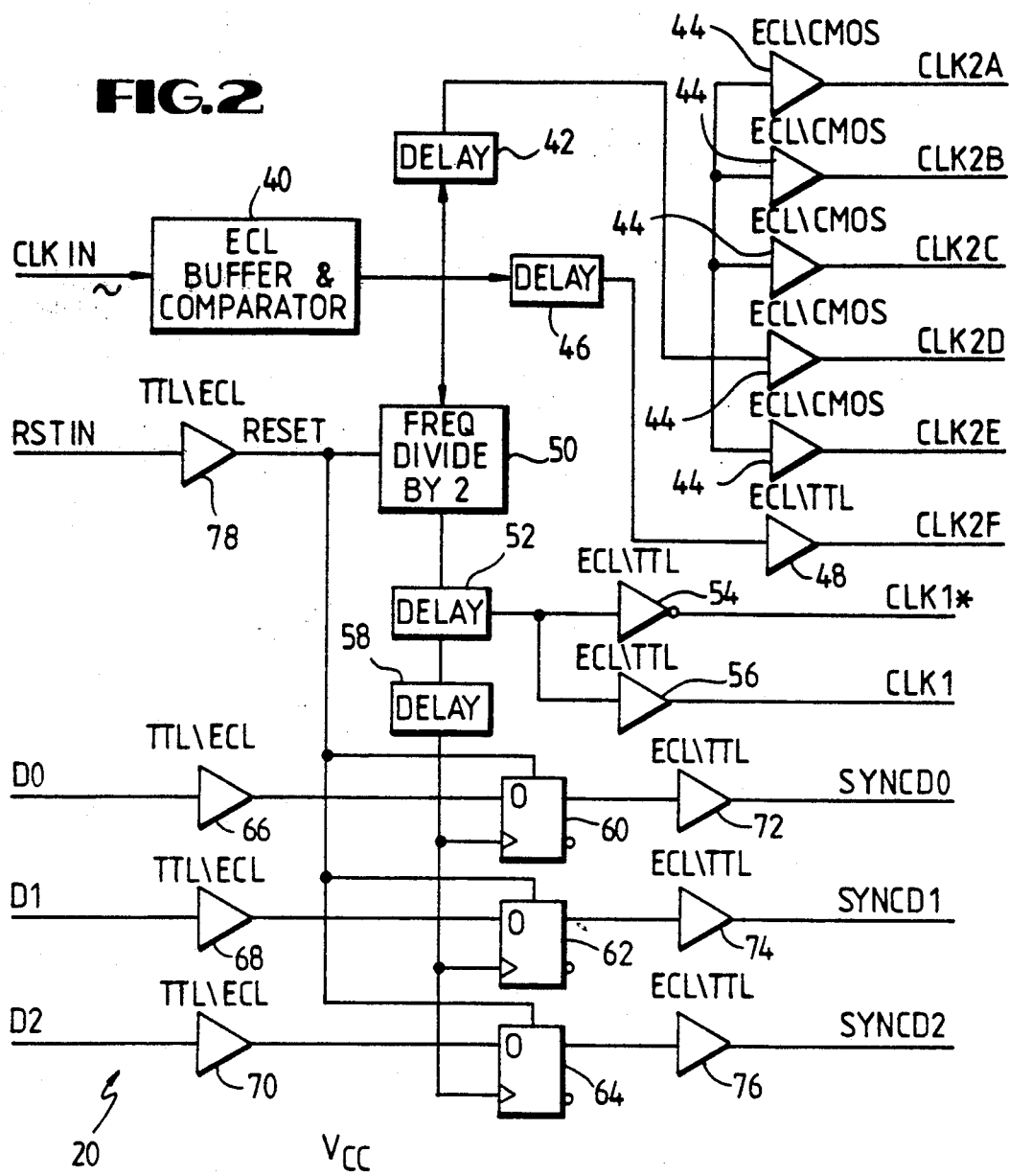
FIG. 2 is a block diagram of the clock squaring circuitry of FIG. 1.

FIG. 2 is a block diagram of the circuitry forming the clock squaring circuitry 20. The CLK IN input receives the sine wave developed at the output of the capacitor 18 or 18', which signal is provided to an emitter coupled logic (ECL) buffer and comparator 40. The clock squaring circuitry 20 is preferably developed using bipolar circuitry so that the necessary delay lines can be accurately developed so that clock skew between the various CLK2 outputs is reduced. Preferably the comparator in the buffer and comparator 40 has a reference level at ½ the peak to peak voltage of the incoming sine wave, preferably 2.7 volts, so that a 50% duty cycle output is developed when a 50% duty cycle sine wave is received. In this manner the ECL buffer and comparator 40 produces a square wave having a duty cycle very close to that of the received sine wave. Preferably the trigger level stability of the buffer and comparator 40 is high so that there is very little clock skew or drift based solely on the buffer and comparator 40.

The output of the buffer and comparator 40 is connected to a first delay block 42 whose output is provided to the inputs of a series of five ECL/CMOS buffers 44. These buffers 44 produce the CMOS logic levels required for proper connection to the microprocessor 30 and other components. The output stage of the buffers 44 will be explained in more detail. The output of the ECL buffer and comparator 40 is also provided to a second delay block 46 whose output is connected to an ECL/TTL buffer 48, which provides a TTL level CLK2 signal for use as desired. The delay blocks 42 and 46 are provided so that the skew between the buffers 44 and 48 is within a preferred 1 nanosecond range.

The final block receiving the output signal of the ECL buffer and comparator 40 is a divide by 2 circuit 50, which has preferably a D-type flip-flop configured in a toggle mode. This provides the divide by 2 capability signal so that the half frequency CLK1I signal can be developed. The output of the divider 50 is provided to a third delay block 52 whose first output is provided to the input of an ECL/TTL inverter 54, whose output signal is referred to as the CLK1* signal, and to the input of a ECL/TTL buffer 56, whose output is referred to as the CLK1 signal. A second output from the third delay block 52 is provided to the input of a fourth delay block 58. The output of the fourth delay block 58 is provided to the clocking input of a series of D-type flip-flops 60, 62 and 64. The flip-flops 60-64 are provided for synchronizing purposes so that any desired signal can be synchronized to the appropriate edge of the CLK1 and CLK2 signals. The third delay block 52 is configured such that the rising edge of the CLK1 signal is within a desired margin of the rising edge of the CLK2 signal, in the preferred embodiment within 1 nanosecond at a 66 MHz CLK2 frequency. The various delay blocks 42, 46, 52 and 58 are developed using conventional ECL signal delay techniques.

Three TTL/ECL buffers 66, 68 and 70 are connected between three inputs D0, D1 and D2 and the D inputs of the flip-flops 60, 62 and 64. The outputs of the three flip-flops 60, 62 and 64 are respectfully connected to three ECL/TTL buffers 72, 74 and 76. The clear inputs of the flip-flops 60, 62 and 64 and a clear input to the divider 50 are provided by the output of a TTL/ECL buffer 78, whose input is connected to the RST IN signal. The RST IN signal is preferably a reset signal utilized in the computer system C and is provided to the flip-flops 60-64 and the divider 50 to allow synchronization of the CLK1 signal with the CLK2 signal and to properly clear the synchronized flip-flops 60-64.

Figure 3:
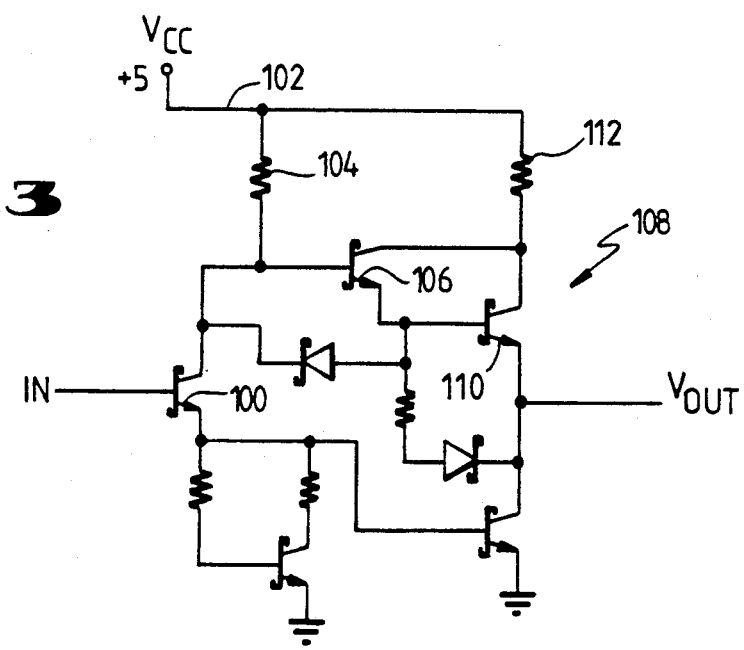
FIG. 3 is the output stage of a TTL gate according to the prior art.

As previously mentioned, the output voltage developed by a conventional totem-pole TTL output is insufficient to properly drive the CMOS levels, particularly the high level, required for the CLK2 inputs of the microprocessor 30 and other components. This can be seen by referring to FIG. 3 which is the output structure of a conventional TTL totem-pole stage. In the preferred embodiment, the transistors are preferably Schottky transistors and thus provide higher speed operations for the output stage. If a low level signal is received at the base of the first transistor 100, the transistor 100 is in a off or open state and thus current can pass from the 5 volt or $V_{cc}$ supply 102 through a pull up resistor 104, through the base to emitter leg of a first transistor 106 of a Darlington pair 108 and through the base to emitter leg of a second transistor 110 in the Darlington pair 100. The emitter of the transistor 110 is considered to be the output terminal and the output voltage signal $V_{out}$ is developed at that point. The collectors of the transistors 106 and 110 forming the Darlington pair 108 are pulled up to the +5 volt $V_{cc}$ level by a resistor 112. Because the various transistors 106 and 110 do not saturate and are in active mode, the critical voltage path is from the +5 volt supply 102 through the resistor 104 and through the two base to emitter drops of transistors 106 and 110. Thus it can be seen that even with relatively low current flowing through the resistor 104 the output voltage signal $V_{out}$ is typically 3.4 volts to 3.7 volts, because of the base to emitter voltage drops.

Figure 4:
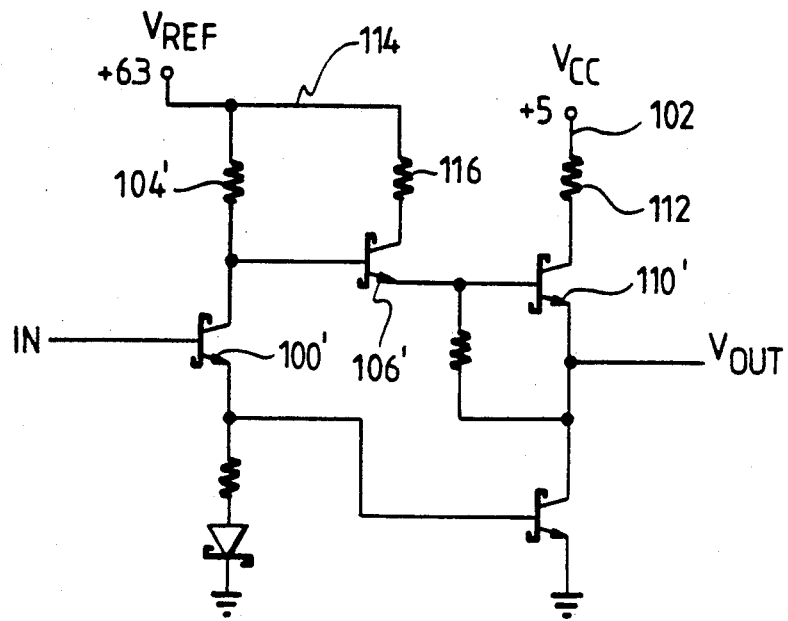
FIG. 4 is a simplified schematic diagram of an output stage of a gate according to the present invention.

The circuitry of FIG. 4 changes the output driver circuitry so that the nominal high voltage output $V_{out}$ is much closer to the nominal 5 volt or $V_{cc}$ supply provided to the microprocessor 30 and well within the specifications required by the CLK2 input high level. This circuit is developed by breaking the Darlington pair 108 into two individual transistors 106' and 110'. The output transistor 110' is pulled up to the +5 volt or $V_{cc}$ supply 102 by a resistor 112, thus providing a normal final output stage. However, the input transistor 100' and the first transistor 106' are pulled up to a level 114 referred to as $V_{ref}$, preferably +6.3 volts, by resistors 104' and 116. In this manner when a low voltage is applied to the base of the input transistor 100', the critical path is from the +6.3 volt $V_{ref}$ supply 114 through the resistor 104' through the base to emitter leg of the transistor 106' and through the base to emitter leg of the transistor 110'. Again because the transistors 106' and 110' are not in saturation but are in active mode, subtracting the various base to emitter voltage drops from +6.3 results in a voltage which is just slightly less then the +5 volts used as the supply voltage for the various circuitry. Thus in this manner a high voltage level $V_{out}$ which is slightly less then the +5 volt supply is readily developed without requiring extra stages of gain or an additional voltage converter or level shifter stage.

Figure 5:
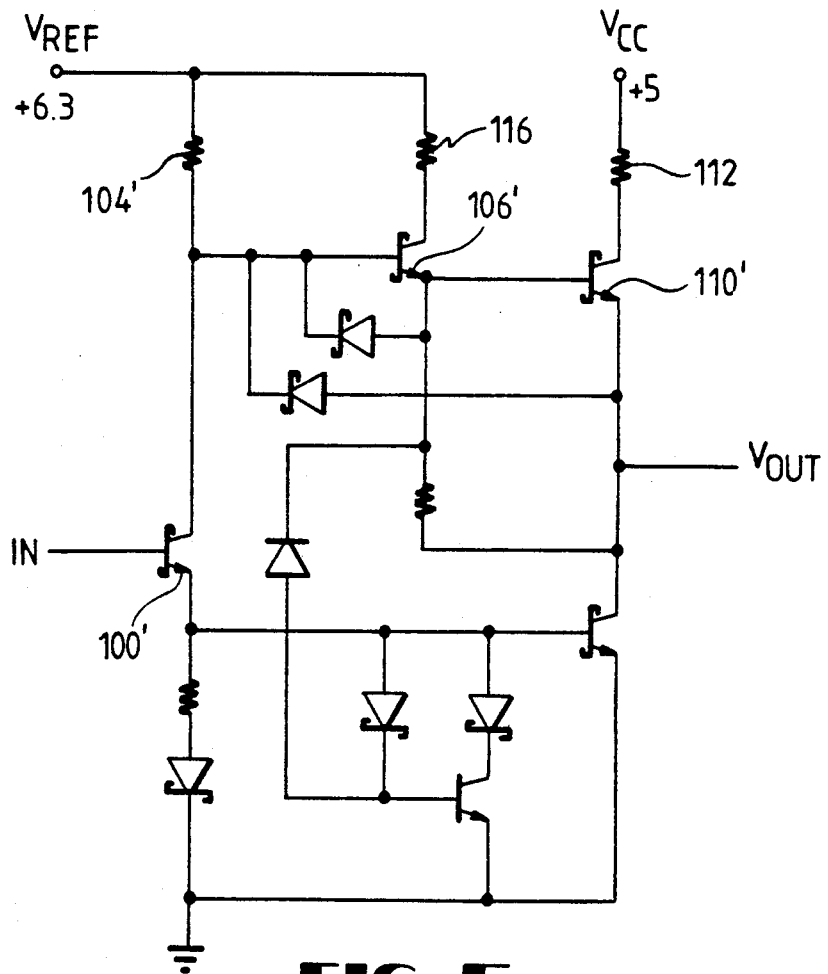
FIG. 5 is a detailed schematic diagram of the output stage of FIG. 4.

FIG. 5 provides more details of a bipolar to CMOS level output stage according to the present invention.

The foregoing disclosure and description of the invention are illustrative and explanatory thereof, and various changes in the size, shape, materials, components, circuit elements, wiring connections and contacts, as well as in the details of the illustrated circuitry and construction and method of operation may be made without departing from the spirit of the invention.

We claim:

1. A method for distributing a clock signal in a digital computer system to an element which uses a square wave clock signal provided to a clock signal input, comprising the steps of:
   developing on a first circuit board a sine wave signal having a frequency of the desired clock signal;
   conducting on said first circuit board said sine wave signal to a first connector mounted on said first circuit board;
   conducting said sine wave signal form a second connector mounted on a second circuit board to a location near the element which uses the square wave clock signal, said second connector removably engageable with said first connector;
   conducting said sine wave signal from said first connector to said second connector when said connectors are engaged;
   converting said conducted sine wave signal into a square wave signal having the same frequency as said conducted sine wave signal; and
   conducting said square wave signal to the clock signal input of the element which uses the square wave clock signal.

2. The method of claim 1, further comprising:
   removing any direct current level from said conducted sine wave signal before converting said sine wave signal to said square wave signal.

3. The method of claim 1, the digital computer system including a plurality of elements which use a square wave clock signal provided to a clock signal input, wherein said steps of converting said conducted sine wave signal into said square wave signal and conducting said square wave signal to the clock signal input of the element which uses the square wave clock signal are repeated for each of the plurality of elements which use the square wave clock signal, whereby each of the plurality of elements receives a repeated square wave signal.

4. A digital logic system, comprising:
   a first circuit board;
   first circuitry on said first circuit board having a square wave clock signal input for receiving a square wave signal of a desired frequency;
   a second circuit board;
   means for developing and outputting a sine wave signal having a frequency of the desired square wave signal frequency, said developing and outputting means located on said second circuit board;
   a first connector mounted on said second circuit board;
   means for conducting on said second circuit board said sine wave signal from said means for developing and outputting said sine wave signal to said first connector;
   a second connector mounted on said first circuit board, said first and second connectors being removably mateable;
   means for conducting said sine wave signal from said first connector to said second connector when said first and second connectors are mated;
   means for conducting said sine wave signal on said first circuit board from said second connector to a location near said first circuitry receiving said square wave signal from said second connector;
   means for receiving said conducted sine wave signal from said second connector and for converting said conducted sine wave signal into a square wave signal having the same frequency as said sine wave signal and outputting said square wave signal, wherein said means for receiving said conducted sine wave signal and for converting said conducted sine wave signal is located on said first circuit board near said circuitry receiving said square wave signal; and
   means for conducting on said first circuit board said output square wave signal from said receiving and converting means to said first circuitry square wave clock signal input.

5. The digital logic system of claim 4, wherein said converting means includes means for removing direct current components from said sine wave signal prior to converting said sine wave signal.

6. The digital logic system of claim 4, further comprising;
   second circuitry on said second circuit board having a square wave clock signal input for receiving a square wave signal of said desired frequency;
   means for conducting said sine wave signal to a location near said second circuitry;
   means for receiving said conducted sine wave signal and for converting said conducted sine wave signal into a second square wave signal having the same frequency as said sine wave signal and outputting said second square signal; and
   means for conducting said second output square wave signal to said second circuitry square wave clock signal input.

* * * * *

UNITED STATES PATENT AND TRADEMARK OFFICE
CERTIFICATE OF CORRECTION

PATENT NO. : 5,281,861
DATED : JANUARY 25, 1994
INVENTOR(S) : THANH T. TRAN, ET AL.

It is certified that error appears in the above-indentified patent and that said Letters Patent is hereby corrected as shown below:

In col. 7, line 8, please replace ";" with --:--.

In col. 7, line 14, please replace "form" with --from--.

In col. 8, line 39, please replace ";" with --:--.

Signed and Sealed this

Thirty-first Day of May, 1994

Attest:

BRUCE LEHMAN

*Attesting Officer*        *Commissioner of Patents and Trademarks*